(12) United States Patent
Mani

(10) Patent No.: US 6,410,434 B1
(45) Date of Patent: Jun. 25, 2002

(54) METHOD AND APPARATUS FOR FORMATION OF IN-SITU DOPED AMORPHOUS SEMICONDUCTOR FILM

(75) Inventor: Balaraman Mani, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/521,591

(22) Filed: Mar. 9, 2000

(51) Int. Cl.$^7$ ................................. H01L 21/44
(52) U.S. Cl. ................. 438/680; 438/765; 438/488; 118/900; 118/715
(58) Field of Search .................. 438/488, 491, 438/511, 558, 680, 684, 765, 762; 118/715, 720, 723, 900

(56) References Cited

U.S. PATENT DOCUMENTS

| | | | |
|---|---|---|---|
| 4,479,831 A | | 6/1983 | Sandow et al. .............. 148/1.5 |
| 4,460,416 A | * | 7/1984 | Wonsowicz ................ 148/174 |
| 4,504,521 A | * | 3/1985 | Widmer et al. .............. 427/85 |
| 4,696,833 A | * | 9/1987 | Monnig et al. ............. 437/225 |
| 5,250,463 A | * | 10/1993 | Mikata et al. .............. 437/109 |
| 5,532,183 A | | 7/1996 | Sugawara ................... 437/101 |
| 5,966,627 A | * | 10/1999 | Brady et al. ............... 438/542 |

OTHER PUBLICATIONS

Shye–Lin Wu, Chung–Len Lee, Tan Fu Lei, and Hue–Chen Chang, Characteristics of Polysilicon Contacted Shallow Junction Diode formed with a Stacked–Amorphous–Silicon Film, IEEE Transactions on Electron Devices, vol. 40, No. 10, Oct. 1993, pp. 1797–1803.

Effiong Ibok and Shyam Garg, A Characterization of the Effect of Deposition Temperature on Polysilicon Properties, J. Electrochem. Soc., vol. 140, No. 10, Oct. 1993, pp. 2927–2937.

Markus Bohm, Advances in Amorphous Silicon Based Thin Film Microelectronics, Solid State Technology, Sep. 1988, pp. 125–131.

* cited by examiner

*Primary Examiner*—Caridad Everhart
*Assistant Examiner*—Calvin Lee
(74) *Attorney, Agent, or Firm*—Monica H. Choi

(57) ABSTRACT

A LPCVD (Low Pressure Chemical Vapor Deposition) process is used for formation of a doped amorphous semiconductor film with in-situ doping of the semiconductor film on a plurality of semiconductor wafers with reduced defects and with predictable electrical characteristics. The plurality of semiconductor wafers are placed in a reaction chamber. The pressure within the reaction chamber is set to be less than approximately 1.0 Torr, and the temperature within the reaction chamber is set to a predetermined temperature in a range of from about 500° Celsius to about 550° Celsius. A semiconductor film reactant and a dopant reactant are introduced into the reaction chamber through at least two gas inlets. Each gas inlet is disposed on a respective location of the reaction chamber near the pluralty of semiconductor wafers, and each gas inlet carries both of the semiconductor film reactant and the dopant reactant. The doped amorphous semiconductor film is formed from the semiconductor film reactant with in-situ doping from the dopant reactant on the plurality of semiconductor wafers in a LPCVD (Low Pressure Chemical Vapor Deposition) process. With the at least two gas inlets carrying the semiconductor film reactant and the dopant reactant in the LPCVD (Low Pressure Chemical Vapor Deposition) process, the doped amorphous semiconductor film deposited on the plurality of semiconductor wafers has more predictable and uniform electrical characteristics such as sheet resistance across a semiconductor wafer.

33 Claims, 4 Drawing Sheets

METHOD AND APPARATUS FOR FORMATION OF IN-SITU DOPED AMORPHOUS SEMICONDUCTOR FILM

TECHNICAL FIELD

The present invention relates generally to fabrication of integrated circuits, and more particularly, to method and apparatus for formation of an in-situ doped amorphous semiconductor film on semiconductor wafers with reduced defects and predictable electrical characteristics.

BACKGROUND OF THE INVENTION

A doped amorphous semiconductor film is used in integrated circuits for various purposes such as for forming a gate structure of a MOSFET (Metal Oxide Semiconductor Field Effect Transistor). The doped amorphous semiconductor film in the prior art is typically formed by first forming a semiconductor film that is substantially undoped and then implanting dopant into the semiconductor film to enhance the conductivity of the semiconductor film. The dopant that has been implanted into the semiconductor film is then activated in a thermal anneal process to further enhance the conductivity of the semiconductor film from activation of the dopant within the semiconductor film, as known to one of ordinary skill in the art of integrate circuit fabrication.

However, such an implantation process is disadvantageous because three steps are used for forming the doped semiconductor film including formation of the undoped semiconductor film, implantation of the dopant into the semiconductor film, and then a thermal anneal process for activation of the dopant within the semiconductor film. Each additional step during integrated circuit fabrication introduces added cost and delay to the manufacture of integrated circuits.

A chemical reaction process such as a chemical vapor deposition process is used for formation of a doped semiconductor film with in-situ doping of the semiconductor film. With "in-situ" doping, dopant is incorporated into the semiconductor film simultaneously during deposition of the semiconductor film. Thus, a chemical reaction process for formation of the semiconductor film with "in-situ" doping avoids the three steps of the dopant implantation process.

Nevertheless, a chemical reaction process of the prior art is disadvantageous because defects may tend to form more easily in such a chemical reaction process than in an implantation process. Furthermore, electrical characteristics such as the sheet resistance of the semiconductor film is typically harder to control in a chemical reaction process than in an implantation process. In addition, the uniformity of electrical characteristics such as the sheet resistance of the semiconductor film across the semiconductor wafer is also typically harder to control in a chemical reaction process than in an implantation process.

For avoiding the three steps of the implantation process, an improved chemical reaction process is desired for formation of a semiconductor film with in-situ doping of the semiconductor film and with reduced defects and with predictable electrical characteristics such as controllable and uniform sheet resistance across the semiconductor wafer.

SUMMARY OF THE INVENTION

Accordingly, in a general aspect of the present invention, an improved LPCVD (Low Pressure Chemical Vapor Deposition) process is used for formation of a doped amorphous semiconductor film with in-situ doping of the semiconductor film on a plurality of semiconductor wafers with reduced defects and with predictable electrical characteristics.

In one embodiment of the present invention, the plurality of semiconductor wafers are placed in a reaction chamber. The pressure within the reaction chamber is set to be less than approximately 1.0 Torr, and the temperature within the reaction chamber is set to a predetermined temperature in a range of from about 500° Celsius to about 550° Celsius. A semiconductor film reactant and a dopant reactant are introduced into the reaction chamber through at least two gas inlets. Each gas inlet is disposed on a respective location within the reaction chamber near the plurality of semiconductor wafers, and each gas inlet carries both of the semiconductor film reactant and the dopant reactant. A doped amorphous semiconductor film is formed from the semiconductor film reactant with in-situ doping from the dopant reactant on the plurality of semiconductor wafers in a LPCVD (Low Pressure Chemical Vapor Deposition) process.

In this manner, with the at least two gas inlets carrying the semiconductor film reactant and the dopant reactant in the LPCVD (Low Pressure Chemical Vapor Deposition) process, the doped amorphous semiconductor film deposited on the plurality of semiconductor wafers has more predictable and uniform electrical characteristics such as sheet resistance across a semiconductor wafer.

The present invention may be used to particular advantage when a doped amorphous silicon film is deposited with the semiconductor film reactant being comprised of silane ($SiH_4$) and with the dopant reactant being comprised of phosphine ($PH_3$) for in-situ doping of phosphorous in the doped amorphous silicon film.

Furthermore, for reducing defects on the semiconductor wafer during the LPCVD (Low Pressure Chemical Vapor Deposition) process, a vacuum suction may be applied through the at least two gas inlets and nitrogen ($N_2$) gas may be purged through the at least two gas inlets alternatingly at least three times before and after deposition of the doped amorphous semiconductor film. In addition, a layer of undoped semiconductor film, such as undoped amorphous silicon film for example, is deposited on a boat that holds the plurality of semiconductor wafers within the reaction chamber when the boat is empty and on components of the reaction chamber before deposition of the doped amorphous semiconductor film.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, and 4 refer to elements having similar structure and function.

DETAILED DESCRIPTION

Figure 1:
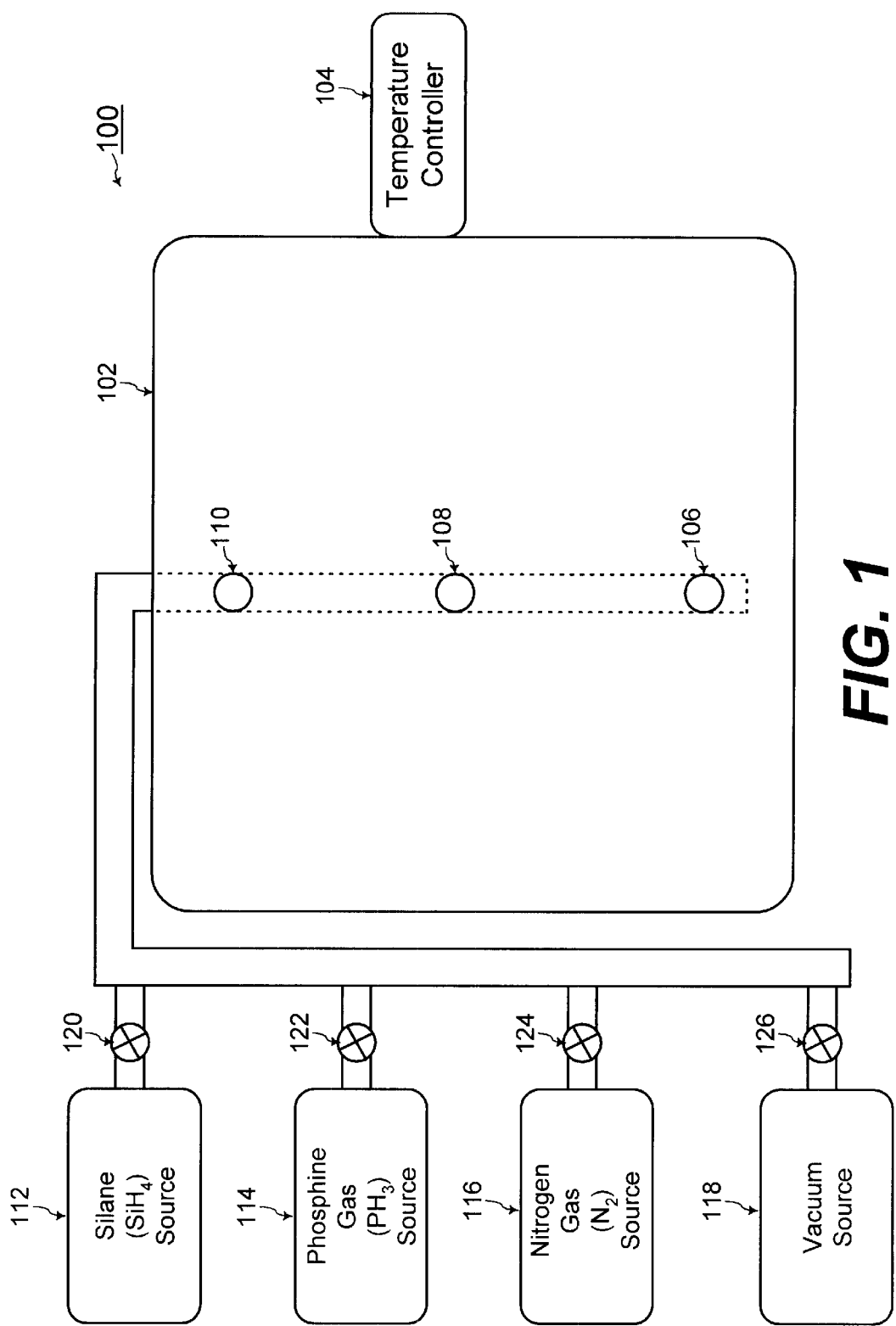
FIG. 1 shows components of an apparatus including a reaction chamber for depositing doped amorphous semiconductor film having predictable electrical characteristics on a plurality of semiconductor wafers, according to an embodiment of the present invention.

Referring to FIG. 1, an apparatus 100 for deposition of doped amorphous silicon film according to one embodiment of the present invention includes a reaction chamber 102. A temperature controller 104 is coupled to the reaction chamber 102 for setting the temperature within the reaction chamber 102 to a predetermined temperature. In one embodiment of the present invention, each of three gas inlets are disposed at a respective location of a wall of the reaction chamber 102. In the embodiment of the present invention as illustrated in FIG. 1, a first gas inlet 106 is disposed at a lower position, a second gas inlet 108 is disposed at a middle position, and a third gas inlet 110 is disposed at an upper position along a vertical dimension of a wall of the reaction chamber 102.

Further referring to FIG. 1, each of the gas inlets 106, 108, and 110 are coupled to a semiconductor film reactant source 112 (which in the embodiment of FIG. 1 is a silane ($SiH_4$) source) and to a dopant reactant source 114 (which in the embodiment of FIG. 1 is a phosphine ($PH_3$) source). The semiconductor film reactant source 112 provides a semiconductor film reactant which in the embodiment of FIG. 1 is silane ($SiH_4$), and the dopant reactant source 114 provides a dopant reactant which in the embodiment of FIG. 1 is phosphine ($PH_3$).

Furthermore, each of the gas inlets 106, 108, and 110 are also coupled to a nitrogen gas ($N_2$) source 116 and to a vacuum source 118. The semiconductor film reactant source 112 is coupled to a first valve 120 for controlling flow of the semiconductor film reactant through the gas inlets 106, 108, and 110. The dopant reactant source 114 is coupled to a second valve 122 for controlling flow of the dopant reactant through the gas inlets 106, 108, and 110. The nitrogen gas ($N_2$) source 116 is coupled to a third valve 124 for controlling flow of the nitrogen gas ($N_2$) through the gas inlets 106, 108, and 110. The vacuum source 118 is coupled to a fourth valve 126 for controlling application of vacuum suction through the gas inlets 106, 108, and 110.

Figure 2:
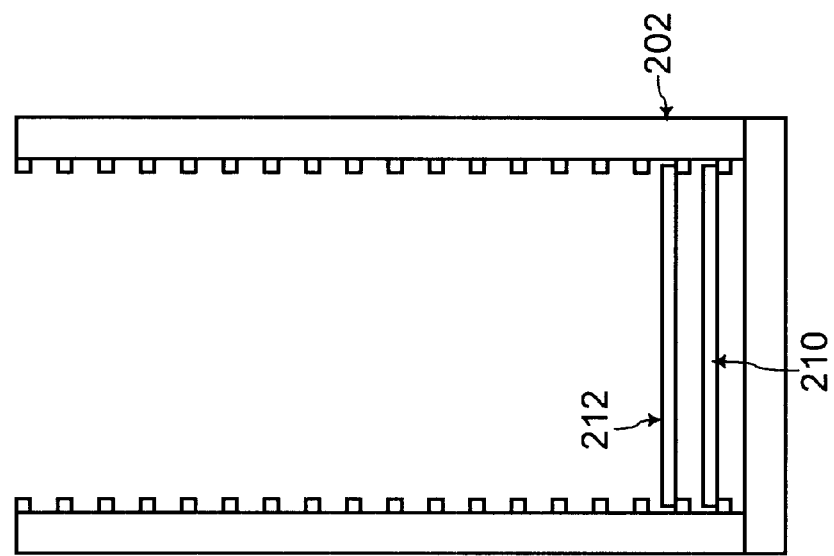
FIG. 2 shows a boat for holding the plurality of semiconductor wafers within the reaction chamber of FIG. 1 during deposition of the doped amorphous semiconductor film.
Figure 2:
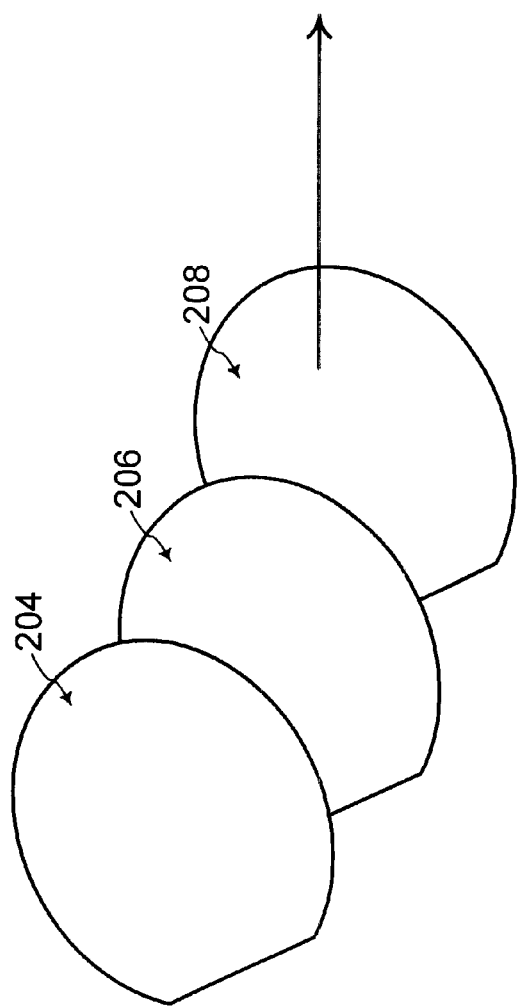

Referring to FIG. 2, a plurality of wafers are loaded within a boat 202 for placement into the reaction chamber 102. Referring to FIG. 2, a plurality of wafers including a first semiconductor wafer 204, a second semiconductor wafer 206, and a third semiconductor wafer 208 are to be placed in the boat 202. The boat 202 is typically comprised of quartz and carries each of a plurality of semiconductor wafers within a respective slot, as known to one of ordinary skill in the art of integrated circuit fabrication. In one embodiment of the boat 202 of FIG. 2, a plurality of semiconductor wafers are stacked vertically with the surface of a semiconductor wafer having integrated circuits fabricated thereon facing upward. Referring to FIG. 2, a fourth semiconductor wafer 210 is placed into a first slot of the boat 202, and a fifth semiconductor wafer 212 is placed into a second slot of the boat 202, for example.

Figure 3:
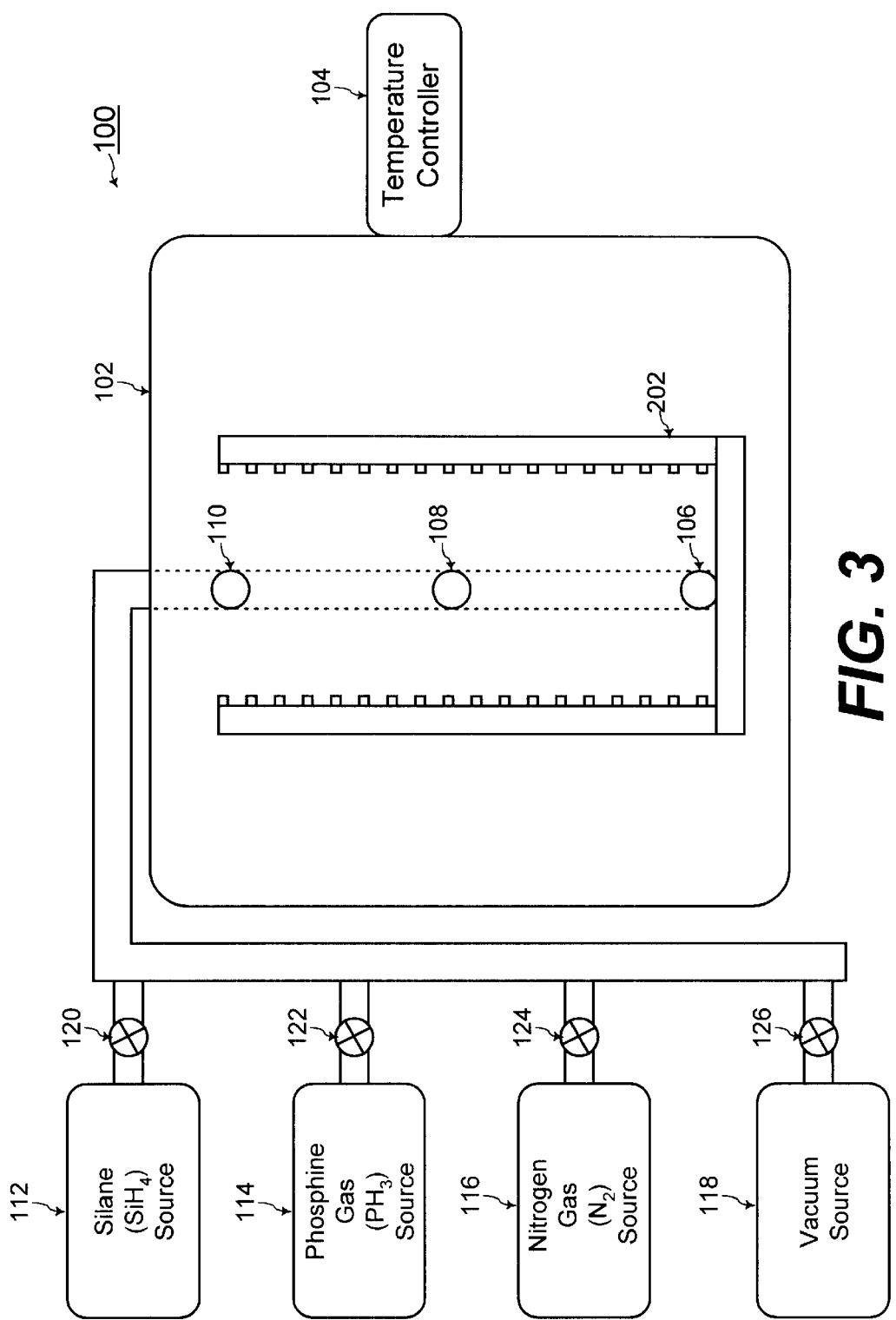
FIG. 3 illustrates placement of the empty boat of FIG. 2 within the reaction chamber of FIG. 1 for formation of an undoped semiconductor film, such as undoped amorphous silicon film for example, on the empty boat and components of the reaction chamber for reducing defects on the semiconductor wafers during deposition of the doped amorphous semiconductor film.

During operation of the apparatus 100 for deposition of the doped amorphous semiconductor film, referring to FIG. 3, the boat 202 that is empty without any semiconductor wafer loaded therein is placed into the reaction chamber 102. The first valve 120 is controlled such that silane ($SiH_4$) flows through the gas inlets 106, 108, and 110 with a flow rate of about 2000 sccm (standard cubic centimeters per minute). The temperature within the reaction chamber 102 is controlled to be set at a predetermined temperature in a range of from about 500° Celsius to about 550° Celsius (preferably about 530° Celsius according to one embodiment of the present invention) by the temperature controller 104. The pressure within the reaction chamber is controlled to be less than about 1.0 Torr (preferably about 0.4 Torr according to one embodiment of the present invention), by mechanisms that are known to one of ordinary skill in the art of integrated circuit fabrication.

With such conditions, a layer of undoped amorphous silicon film is initially deposited on the empty boat 202 and on components of the reaction chamber 102 located within the reaction chamber 102. In one embodiment of the present invention, about 1000 Å (angstroms) of undoped amorphous silicon film coats the empty boat 202 and the components within the reaction chamber 102. Formation of the undoped amorphous silicon film on the empty boat 202 and on the components within the reaction chamber 102 before deposition of the doped amorphous semiconductor film on the semiconductor wafers is advantageous for reducing defects during subsequent deposition of the doped amorphous semiconductor film on the semiconductor wafers.

Figure 4:
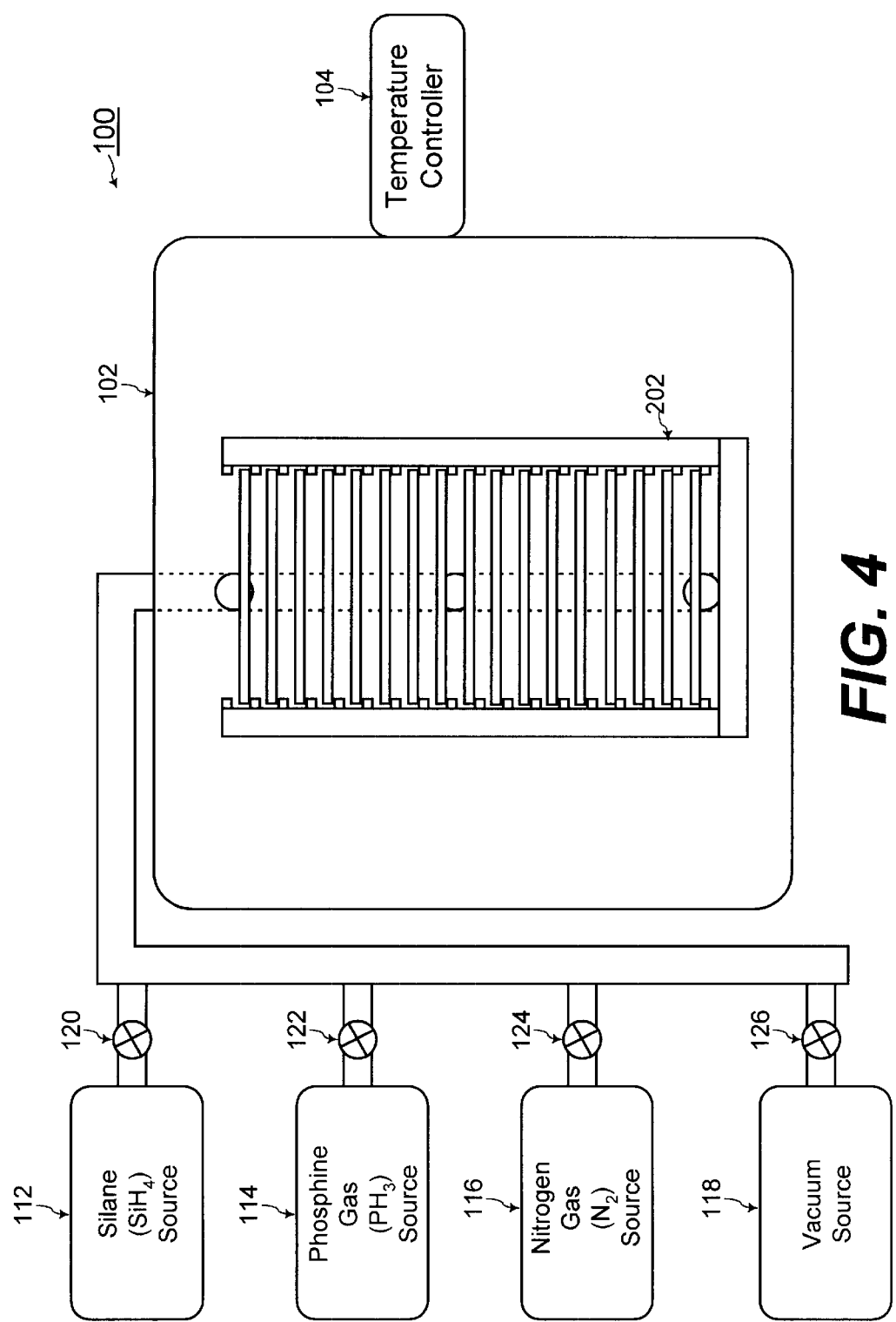
FIG. 4 illustrates placement of the boat of FIG. 2 having the plurality of semiconductor wafers loaded therein within the reaction chamber of FIG. 1 for deposition of the doped amorphous semiconductor film on the plurality of semiconductor wafers.

Referring to FIG. 4, for deposition of the doped amorphous semiconductor film on the semiconductor wafers, the boat 202 having undoped silicon film coated thereon is loaded with the plurality of semiconductor wafers. Referring to FIG. 4, the boat 202 having the plurality of semiconductor wafers loaded therein is then placed into the reaction chamber 102. The plurality of semiconductor wafers are stacked within the boat 202 along the vertical dimension of the linear alignment of the gas inlets 106, 108, and 110 such that the plurality of semiconductor wafers are substantially near the gas inlets 106, 108, and 110.

After placement of the boat 202 having the plurality of semiconductor wafers loaded therein within the reaction chamber 102, the valves 124 and 126 are controlled such that a vacuum suction from the vacuum source 118 is applied on the gas inlets 106, 108, and 110 and such that nitrogen gas ($N_2$) is purged through the gas inlets 106, 108, and 110 alternatingly. Such alternating application of the vacuum suction and the nitrogen gas ($N_2$) purge through the gas inlets 106, 108, and 110 is repeated at least three times for reducing the number of contaminant particles within the reaction chamber 102.

After such repeated application of the vacuum suction and the nitrogen gas ($N_2$) purge through the gas inlets 106, 108, and 110, the valves 120 and 122 are controlled such that the semiconductor reactant source (i.e. silane ($SiH_4$) in FIG. 4) and the dopant reactant source (i.e. phosphine ($PH_3$) in FIG. 4) both flow through each of the gas inlets 106, 108, and 110. In one embodiment of the present invention, silane flows through each of the gas inlets 106, 108, and 110 with a flow rate of 2000 sccm (standard cubic centimeters per minute). Furthermore, in one embodiment of the present invention, phosphine flows through the first gas inlet 106 with a flow rate of 2 sccm (standard cubic centimeter per minute), through the second gas inlet 108 with a flow rate of 2.8 sccm (standard cubic centimeter per minute), and through the third gas inlet 110 with a flow rate of 20 sccm (standard cubic centimeter per minute).

The temperature within the reaction chamber 102 is controlled to be set at a predetermined temperature in a range of from about 500° Celsius to about 550° Celsius (preferably about 530° Celsius according to one embodiment of the present invention) by the temperature controller 104. The pressure within the reaction chamber 102 is controlled to be less than about 1.0 Torr (preferably about 0.4 Torr according to one embodiment of the present invention) by mechanisms that are known in to one of ordinary skill in the art of integrated circuit fabrication.

With such conditions, a layer of doped amorphous silicon film is formed from the semiconductor film reactant (i.e. silane ($SiH_4$) in FIG. 4) with in-situ phosphorous doping from the dopant reactant (i.e. phosphine ($PH_3$) in FIG. 4) on the plurality of semiconductor wafers within the boat 202 in a LPCVD (Low Pressure Chemical Vapor Deposition) process. For example, with a deposition time of about 9 minutes, approximately 900 Å (angstroms) of phosphorous doped amorphous silicon film is deposited on the plurality of semiconductor wafers within the boat 202 according to one embodiment of the present invention.

In this manner, referring to FIG. 4, because of the positioning of the three gas inlets 106, 108, and 110 along the vertical dimension of the stacked configuration of the plurality of semiconductor wafers within the boat 202, the doped amorphous silicon film deposited on the plurality of semiconductor wafers within the boat 202 has more uniform sheet resistance across a whole wafer and from wafer to wafer. In addition, the concentration of the dopant reactant from the dopant reactant source 114 may be controlled for predictably controlling the sheet resistance of the doped amorphous silicon film with the positioning of the three gas inlets 106, 108, and 110 along the vertical dimension of the stacked configuration of the plurality of semiconductor wafers within the boat 202. For example, when the concentration of phosphine ($PH_3$) is about 1% (by volume) within a helium carrier, with the flow rates of the silane and phosphine described herein, the concentration of the phosphorous within the doped amorphous silicon film is about $1 \times 10^{20}$ phosphorous atoms per centimeters squared.

For the example phosphorous doped amorphous silicon film having 900 Å (angstroms) thickness and phosphorous concentration of about $1 \times 10^{20}$ phosphorous atoms per centimeters squared, the sheet resistance of such a doped amorphous silicon film is in a range of from about 580 to about 620 ohms per square across a semiconductor wafer and from semiconductor wafer to semiconductor wafer.

In addition, during the LPCVD (Low Pressure Chemical Vapor Deposition) of the present invention, phosphorous is in-situ doped into the amorphous silicon film such that additional fabrication steps of a dopant implantation process are avoided. Elimination of the additional fabrication steps results in savings of cost and delay during fabrication of integrated circuits on the semiconductor wafers.

Referring back to FIG. 4, after deposition of the doped amorphous semiconductor film on the plurality of semiconductor wafers within the boat 202, the valves 120 and 122 are controlled to stop flow of the semiconductor film reactant (i.e. silane ($SiH_4$) in FIG. 4) and the dopant reactant (i.e. phosphine ($PH_3$) in FIG. 4) through the gas inlets 106, 108, and 110. The valves 124 and 126 are then controlled such that a vacuum suction from the vacuum source 118 is applied on the gas inlets 106, 108, and 110 and such that nitrogen gas ($N_2$) is purged through the gas inlets 106, 108, and 110 alternatingly. Such alternating application of the vacuum suction and the nitrogen gas ($N_2$) purge through the gas inlets 106, 108, and 110 is repeated at least three times for reducing the number of contaminant particles within the reaction chamber 102. In addition, for further reducing the number of contaminant particles within the reaction chamber 102, nitrogen gas ($N_2$) from the nitrogen gas ($N_2$) source 116 is purged through the gas inlets 106, 108, and 110 when the reaction chamber 102 is idle for at least 4 hours.

In this manner, by forming the undoped silicon film on the boat 202 and the components of the reaction chamber 102 within the reaction chamber 102 and with the repeated application of the vacuum suction and the nitrogen gas ($N_2$) purge through the gas inlets 106, 108, and 110, defects on the doped amorphous semiconductor film are minimized with the present invention. The defect density decreased to approximately 30 defects per semiconductor wafer with the present invention from approximately 300 defects per semiconductor wafer with the prior art chemical process for deposition of the doped amorphous semiconductor film.

The present invention may be used to particular advantage when the doped amorphous semiconductor film is used as a gate structure of a MOSFET (Metal Oxide Semiconductor Field Effect Transistor) during fabrication of integrated circuits. The doped amorphous semiconductor film formed according to the LPCVD (Low Pressure Chemical Vapor Deposition) process of the present invention avoids the extraneous steps of a dopant implantation process and has minimized defects and predictable electrical characteristics.

The foregoing is by way of example only and is not intended to be limiting. For example, any specified thickness or any specified material of any structure described herein is by way of example only. In addition, the number and positioning of the gas inlets 106, 108, and 110 in FIGS. 1, 3, and 4 are by way of example only, and the present invention may be practiced with any number of at least two gas inlets that are positioned substantially near the plurality of semiconductor wafers, as would be apparent to one of ordinary skill in the art of integrated circuit fabrication from the description herein. Also, a boat holding any large number of semiconductor wafers may be placed into the reaction chamber 102 during practice of the present invention. Furthermore, as will be understood by those skilled in the art, the structures described herein may be made or used in the same way regardless of their position and orientation. Accordingly, it is to be understood that terms and phrases used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for forming a doped amorphous semiconductor film on a plurality of semiconductor wafers, the method including the steps of:

A. placing said plurality of semiconductor wafers in a reaction chamber;

B. setting a pressure within said reaction chamber to be less than approximately 1.0 Torr;

C. setting a temperature within the reaction chamber to a predetermined temperature in a range of from about 500° Celsius to about 550° Celsius; and D. flowing a semiconductor film reactant and a dopant reactant into said reaction chamber through at least two gas inlets, each gas inlet being disposed on a respective location of said reaction chamber near said plurality of semiconductor wafers;

wherein said doped amorphous semiconductor film is formed from said semiconductor film reactant with in-situ doping from said dopant reactant on said plurality of semiconductor wafers in a LPCVD (Low Pressure Chemical Vapor Deposition) process;

and wherein said plurality of wafers are placed into a boat holding said plurality of wafers in a stacked configuration along a vertical dimension of said reaction chamber, and wherein said at least two gas inlets are arranged linearly along said vertical dimension of said reaction chamber near said stacked configuration of said plurality of semiconductor wafers;

and wherein each of said at least two gas inlets carries both of said semiconductor film reactant and said dopant reactant;

and wherein said dopant reactant flows through a bottom gas inlet of said at least two gas inlets with a first flow rate, and wherein said dopant reactant flows through an upper gas inlet of said at least two gas inlets with a second flow rate;

and wherein said upper gas inlet is disposed above said bottom gas inlet along said vertical dimension of said reaction chamber, and wherein said second flow rate of said dopant reactant through said upper gas inlet is greater than said first flow rate of said dopant reactant through said bottom gas inlet.

2. The method of claim 1, wherein a doped amorphous silicon film is deposited with said semiconductor film reactant being comprised of silane ($SiH_4$), and wherein said dopant reactant is comprised of phosphine ($PH_3$) for in-situ doping of phosphorous in said amorphous silicon film.

3. The method of claim 2, wherein said semiconductor film reactant and said dopant reactant are flown into said reaction chamber through a first gas inlet with a flow rate of 2 sccm (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane.

4. The method of claim 3, wherein said doped amorphous silicon film with said in-situ phosphorous doping is deposited to have a thickness of about 900 Å (angstroms) with a deposition time of about 9 minutes.

5. The method of claim 1, further including the steps of:
E. applying a vacuum suction through said at least two gas inlets before said step D; and
F. purging nitrogen ($N_2$) gas through said at least two gas inlets before said step D.

6. The method of claim 5, wherein said step E and said step F are each alternatingly repeated at least three times before said step D.

7. The method of claim 1, further including the steps of:
G. applying a vacuum suction through said at least two gas inlets after deposition of said doped amorphous semiconductor film; and
H. purging nitrogen ($N_2$) gas through said at least two gas inlets after deposition of said doped amorphous semiconductor film.

8. The method of claim 7, wherein said step G and said step H are each alternatingly repeated at least three times after deposition of said doped amorphous semiconductor film.

9. The method of claim 1, further including the step of:
purging nitrogen ($N_2$) gas through said at least two gas inlets when said reaction chamber is idle for at least 4 hours.

10. The method of claim 1, further including the step of:
varying the concentration of said dopant reactant flowing through said at least two gas inlets for varying dopant concentration of said in-situ doping from said dopant reactant in said doped amorphous semiconductor film.

11. A method for forming a phosphorous doped amorphous silicon film on a plurality of semiconductor wafers, the method including the steps of:

A. coating a boat for holding said plurality of semiconductor wafers when said boat is empty and coating components of said reaction chamber with a layer of undoped amorphous silicon film having a thickness of about 1000 Å (angstroms);

B. placing said plurality of semiconductor wafers in a reaction chamber, wherein said plurality of semiconductor wafers are placed into said boat in a stacked configuration along a vertical dimension of said reaction chamber;

C. setting a pressure within said reaction chamber to be about 0.4 Torr;

D. setting a temperature within the reaction chamber to be about 530° Celsius;

E. applying a vacuum suction through three gas inlets that are arranged linearly along said vertical dimension of said reaction chamber near said stacked configuration of said plurality of semiconductor wafers;

F. purging nitrogen ($N_2$) gas through said three gas inlets; wherein said step E and said step F are each alternatingly repeated at least three times;

G. flowing silane ($SiH_4$) gas and phosphine ($PH_3$) gas into said reaction chamber through said three gas inlets including through a first gas inlet with a flow rate of 2 seem (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane, and wherein said phosphorous doped amorphous silicon film is formed from silane with in-situ phosphorous doping from said phosphine on said plurality of semiconductor wafers in a LPCVD (Low Pressure Chemical Vapor Deposition) process, and wherein said amorphous silicon with said in-situ phosphorous doping is deposited to have a thickness of about 900 Å (angstroms) with a deposition time of about 9 minutes;

and wherein the concentration of said phosphine flowing through said three gas inlets is varied for varying dopant concentration of said in-situ phosphorous doping of said amorphous silicon film;

H. applying a vacuum suction through said three gas inlets after deposition of said doped amorphous silicon film;

I. purging nitrogen ($N_2$) gas through said three gas inlets after deposition of said doped amorphous silicon film; wherein said step H and said step I are each alternatingly repeated at least three times after deposition of said doped amorphous silicon film; and J. purging nitrogen (N$_2$) gas through said three gas inlets when said reaction chamber is idle for at least 4 hours.

12. A method for forming a doped amorphous semiconductor film on a plurality of semiconductor wafers, the method including the steps of:

placing said plurality of semiconductor wafers in a reaction chamber;

setting a pressure within said reaction chamber to be less than approximately 1.0 Torr;

setting a temperature within the reaction chamber to a predetermined temperature in a range of from about 500° Celsius to about 550° Celsius;

flowing a semiconductor film reactant and a dopant reactant into said reaction chamber through at least two gas inlets, each gas inlet being disposed on a respective location of said reaction chamber near said plurality of semiconductor wafers, and each gas inlet carrying both of said semiconductor film reactant and said dopant reactant;

wherein said doped amorphous semiconductor film is formed from said semiconductor film reactant with in-situ doping from said dopant reactant on said plurality of semiconductor wafers in a LPCVD (Low Pressure Chemical Vapor Deposition) process;

and wherein said plurality of semiconductor wafers are placed into a boat that holds said plurality of semiconductor wafers within said reaction chamber, and coating said boat when said boat is empty and coating components of said reaction chamber with a layer of undoped semiconductor film before said step of placing said plurality of semiconductor wafers in said reaction chamber.

13. The method of claim 2, wherein said undoped semiconductor film is an undoped amorphous silicon film.

14. The method of claim 13, wherein said undoped amorphous silicon film has a thickness of about 1000 Å (angstroms).

15. The method of claim 12, further including the steps of:

applying a vacuum suction through said at least two gas inlets before said step of flowing said semiconductor film reactant and said dopeant reactant into said reaction chamber; and purging nitrogen (N$_2$) gas through said at least two gas inlets before said step of flowing said semiconductor film reactant and said dopant reactant into said reaction chamber.

16. The method of claim 15, wherein said step of applying said vacuum suction and said step of purging nitrogen (N$_2$) gas are each alternatingly repeated at least three times before said step of flowing said semiconductor film reactant and said dopant reactant into said reaction chamber.

17. The method of claim 12, further including the steps of:

applying a vacuum suction through said at least two gas inlets after deposition of said doped amorphous semiconductor film; and purging nitrogen (N$_2$) gas through said at least two gas inlets after deposition of said doped amorphous semiconductor film.

18. The method of claim 17, wherein said step of applying said vacuum suction and said step of purging nitrogen (N$_2$) gas are each alternatingly repeated at least three times after deposition of said doped amorphous semiconductor film.

19. The method of claim 12, wherein said plurality of wafers are placed into a boat holding said plurality of wafers in a stacked configuration along a vertical dimension of said reaction chamber, and wherein said at least two gas inlets are arranged linearly along said vertical dimension of said reaction chamber near said stacked configuration of said plurality of semiconductor wafers.

20. The method of claim 12, further including the step of:

purging nitrogen (N$_2$) gas through said at least two gas inlets when said reaction chamber is idle for at least 4 hours.

21. The method of claim 12, further including the step of:

varying the concentration of said dopant reactant flowing through said at least two gas inlets for varying dopant concentration of said in-situ doping from said dopant reactant in said doped amorphous semiconductor film.

22. The method of claim 12, wherein a doped amorphous silicon film is deposited with said semiconductor film reactant being comprised of silane (SiH$_4$), and wherein said dopant reactant is comprised of phosphine (PH$_3$) for in-situ doping of phosphorous in said amorphous silicon film.

23. The method of claim 22, wherein said semiconductor film reactant and said dopant reactant are flown into said reaction chamber through a first gas inlet with a flow rate of 2 sccm (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane.

24. The method of claim 23, wherein said doped amorphous silicon film with said in-situ phosphorous doping is deposited to have a thickness of about 900 Å (angstroms) with a deposition time of about 9 minutes.

25. An apparatus for forming a doped amorphous semiconductor film on a plurality of semiconductor wafers, the apparatus comprising:

a reaction chamber having a pressure setting that is less than about 1.0 Torr and having a predetermined temperature setting in a range of from about 500° Celsius to about 550° Celsius;

a boat for holding said plurality of semiconductor wafers within said reaction chamber;

at least two gas inlets with each gas inlet being disposed on a respective location of said reaction chamber near said plurality of semiconductor wafers;

a semiconductor film reactant source coupled to each of said at least two gas inlets; and a dopant reactant source coupled to each of said at least two gas inlets;

wherein each gas inlet carries into said reaction chamber both of a semiconductor film reactant from said semiconductor film reactant source and a dopant reactant from said dopant reactant source;

and wherein said doped amorphous semiconductor film is formed from said semiconductor film reactant with in-situ doping from said dopant reactant on said plurality of semiconductor wafers in a LPCVD (Low Pressure Chemical Vapor Deposition) process within said reaction chamber;

and wherein said plurality of wafers are placed into a boat holding said plurality of wafers in a stacked configuration along a vertical dimension of said reaction chamber, and wherein said at least two gas inlets are arranged linearly along said vertical dimension of said reaction chamber near said stacked configuration of said plurality of semiconductor wafers;

and wherein said dopant reactant flows through a bottom gas inlet of said at least two gas inlets with a first flow rate, and wherein said dopant reactant flows through an upper gas inlet of said at least two gas inlets with a second flow rate;

and wherein said upper gas inlet is disposed above said bottom gas inlet along said vertical dimension of said reaction chamber, and wherein said second flow rate of said dopant reactant through said upper gas inlet is greater than said first flow rate of said dopant reactant through said bottom gas inlet.

26. The apparatus of claim 25, further comprising:

a vacuum suction source coupled to said at least two gas inlets; and a nitrogen ($N_2$) gas source coupled to said at least two gas inlets;

wherein said vacuum suction and a purge of said nitrogen ($N_2$) gas is alternately applied to said at least two gas inlets at least three times before flow of said semiconductor film reactant and said dopant reactant through said at least two gas inlets for deposition of said doped amorphous semiconductor film;

and wherein said vacuum suction and said purge of said nitrogen ($N_2$) gas is alternately applied to said at least two gas inlets at least three times after deposition of said doped amorphous semiconductor film.

27. The apparatus of claim 25, wherein a doped amorphous silicon film is deposited with said semiconductor film reactant being comprised of silane ($SiH_4$), and wherein said dopant reactant is comprised of phosphine ($PH_3$) for in-situ doping of phosphorous in said doped amorphous silicon film.

28. The apparatus of claim 27, wherein said semiconductor film reactant and said dopant reactant are flown into said reaction chamber through a first gas inlet with a flow rate of 2 sccm (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane.

29. An apparatus for forming a doped amorphous semiconductor film on a plurality of semiconductor wafers, the apparatus comprising:

a reaction chamber having a pressure setting that is less than about 1.0 Torr and having a predetermined temperature setting in a range of from about 500° Celsius to about 550° Celsius;

a boat for holding said plurality of semiconductor wafers within said reaction chamber;

at least two gas inlets with each gas inlet being disposed on a respective location of said reaction chamber near said plurality of semiconductor wafers;

a semiconductor film reactant source coupled to each of said at least two gas inlets; and a dopant reactant source coupled to each of said at least two gas inlets;

wherein each gas inlet carries into said reaction chamber both of a semiconductor film reactant from said semiconductor film reactant source and a dopant reactant from said dopant reactant source;

and wherein said doped amorphous semiconductor film is formed from said semiconductor film reactant with in-situ doping from said dopant reactant on said plurality of semiconductor wafers in a LPCVD (Low Pressure Chemical Vapor Deposition) process within said reaction chamber;

and wherein said boat when said boat is empty and components of said reaction chamber are coated with a layer of undoped semiconductor film before said plurality of semiconductor wafers are placed into said reaction chamber.

30. The apparatus of claim 29, further comprising:

a vacuum suction source coupled to said at least two gas inlets; and a nitrogen ($N_2$) gas source coupled to said at least two gas inlets;

wherein said vacuum suction and a purge of said nitrogen ($N_2$) gas is alternately applied to said at least two gas inlets at least three times before flow of said semiconductor film reactant and said dopant reactant through said at least two gas inlets for deposition of said doped amorphous semiconductor film;

and wherein said vacuum suction and said purge of said nitrogen ($N_2$) gas is alternately applied to said at least two gas inlets at least three times after deposition of said doped amorphous semiconductor film.

31. The apparatus of claim 29, wherein said plurality of wafers is placed into said boat holding said plurality of wafers in a stacked configuration along a vertical dimension of said reaction chamber, and wherein said at least two gas inlets are arranged linearly along said vertical dimension of said reaction chamber near said stacked configuration of said plurality of semiconductor wafers.

32. The apparatus of claim 29, wherein a doped amorphous silicon film is deposited with said semiconductor film reactant being comprised of silane ($SiH_4$), and wherein said dopant reactant is comprised of phosphine ($PH_3$) for in-situ doping of phosphorous in said doped amorphous silicon film.

33. The apparatus of claim 32, wherein said semiconductor film reactant and said dopant reactant are flown into said reaction chamber through a first gas inlet with a flow rate of 2 sccm (standard cubic centimeters per minute) of phosphine and a flow rate of 2000 sccm (standard cubic centimeters per minute) of silane, through a second gas inlet with a flow rate of 2.8 sccm (standard cubic centimeters per minute) of phosphine and a flow rate of 2000 sccm (standard cubic centimeters per minute) of silane, and through a third gas inlet with a flow rate of 20 sccm (standard cubic centimeters per minute) of phosphine and a flow rate of 2000 sccm (standard cubic centimeters per minute) of silane.

* * * * *